US011539267B2

(12) United States Patent
Channaiah

(10) Patent No.: US 11,539,267 B2
(45) Date of Patent: Dec. 27, 2022

(54) DYNAMIC CURVED SCREEN

(71) Applicant: Intel Corporation, Santa Clara, CA (US)

(72) Inventor: Yogesh Channaiah, Karnatak (IN)

(73) Assignee: Intel Corporation, Santa Clara, CA (US)

( * ) Notice: Subject to any disclaimer, the term of this patent is extended or adjusted under 35 U.S.C. 154(b) by 402 days.

(21) Appl. No.: 16/701,490

(22) Filed: Dec. 3, 2019

(65) Prior Publication Data

US 2020/0373810 A1    Nov. 26, 2020

(51) Int. Cl.
*H02K 7/116* (2006.01)
*H01L 51/00* (2006.01)
*G05B 19/042* (2006.01)
*H01L 27/32* (2006.01)

(52) U.S. Cl.
CPC ......... *H02K 7/1166* (2013.01); *G05B 19/042* (2013.01); *H01L 27/32* (2013.01); *H01L 51/0097* (2013.01); *G05B 2219/23143* (2013.01)

(58) Field of Classification Search
CPC .... H02K 7/1166; H01L 27/32; G05B 19/042; G05B 2219/23143
See application file for complete search history.

(56) References Cited

U.S. PATENT DOCUMENTS

2013/0207946 A1    8/2013 Kim et al.

FOREIGN PATENT DOCUMENTS

WO    WO 2017/036562 A1    3/2017

OTHER PUBLICATIONS

Extended European Search Report dated Mar. 23, 2021 for European Patent Application No. 20197341.7, 7 pages.

*Primary Examiner* — Anthony Ho
(74) *Attorney, Agent, or Firm* — Schwabe, Williamson & Wyatt, P.C.

(57) ABSTRACT

Embodiments of the present disclosure pertain to a dynamic curved screen. In one embodiment, the present disclosure includes display comprising a flexible screen. A sensor is configured on the display to sense a distance between a user and the screen. The distance may be used to determine a position of the user relative to the screen. An actuator is configured to adjust a curvature of the flexible screen based on the distance. Accordingly, the field of view of the user is improved.

17 Claims, 7 Drawing Sheets

DYNAMIC CURVED SCREEN

BACKGROUND

The present disclosure relates to a dynamic curved screen. More particularly, the present disclosure relates to techniques for adjusting the curvature of a screen.

The growth of display technologies has led users to become increasingly accustomed to larger and more realistic visual experiences. Increasingly, users are combining multiple displays to produce larger and larger Fields of View (FOV). However, users viewing multiple screens, or even a single large screen, often have the outermost edges outside their FOV, and consequently must move their head unnecessarily to fully view content. For a variety of applications, it would be desirable to optimize the FOV.

The present disclosure is directed to a dynamic screen that improves field of view.

BRIEF DESCRIPTION OF THE DRAWINGS

Various embodiments of the present disclosure are illustrated by way of example and not limitation in the figures of the accompanying drawings.

FIG. 6 illustrates one embodiment with an electric motor driving a worm gear.

DETAILED DESCRIPTION

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

In one embodiment, a curvature of a screen is adjusted based on a distance to a user, also called a viewer, of the screen. That is, based upon the distance from the screen to the viewer, the curvature of the screen will be adjusted. The distance to the viewer can be measured, for example, by a sensor located on a display housing coupled to the screen. The sensor can be of a variety of types, for example, but not limited to proximity sensors, Time of Flight (ToF) sensors, etc.

Figure 1:
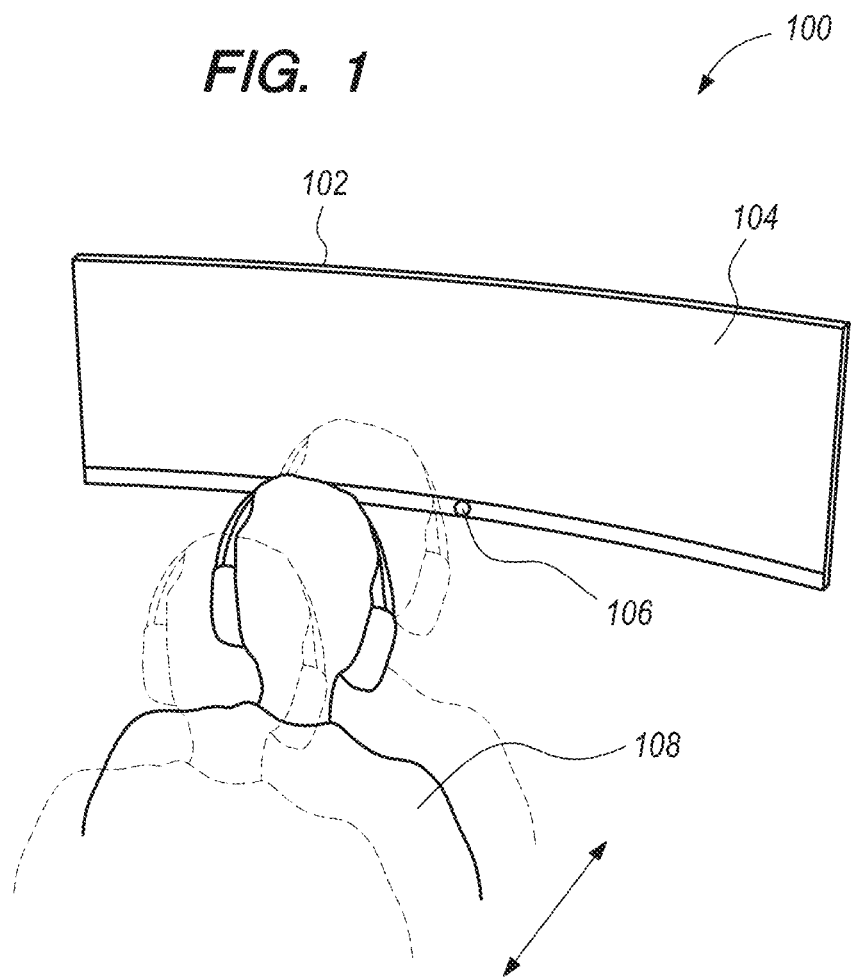
FIG. 1 illustrates a dynamic curved screen according to an embodiment.

FIG. 1 illustrates, generally at 100, one embodiment of the present disclosure. Features and advantages of the present disclosure include a display 102 comprising a screen 104. The screen may have a dynamic curvature, for example, where the curvature of the screen may be changed based on the position of one or more viewers 108. In one example embodiment, the screen 104 may be a flexible screen, such as a flexible LED or Flexible Organic Light Emitting Diode (FOLED) array, for example. The screen curvature may be adjusted, thus changing the radius of curvature of the screen. At 106 is shown a sensor to measure the viewer's position. Various example sensors for measuring the position of one or more users are illustrated below. As the position of the user changes, such as a distance between a user and the screen, for example, one or more sensors may detect the changed position and adjust the curvature of screen 104 to optimize the field of view, for example.

While FIG. 1 illustrates a single viewer 108, the technique is not so limited and two viewers or more may be present. In the case of two or more viewers, the sensor 106 measures the position of all the viewers and adjusts the curvature of the screen 104 accordingly.

While FIG. 1 illustrates a single sensor to measure the viewer's position as located near the bottom center of the display 102, the technique is not so limited. Additional sensors may be used. Additionally, one or more sensors may be located at or near the top and/or bottom and/or sides of the display 102.

In one example embodiment described in more detail below, a screen 104 may be attached to a flexible sheet metal part (e.g., a backing). Additionally, vertical center of the flexible screen may be fixed to a portion of a housing of the display 102. The vertical outer edges of the flexible screen (not shown in FIG. 1) may be adjusted using an actuator (not shown in FIG. 1). That is, while the vertical centerline of the screen is fixed to the housing of display 102, the edges of the flexible screen are movable. Accordingly, the actuator may adjust the curvature of the screen as illustrated in more detail below.

Figure 2:
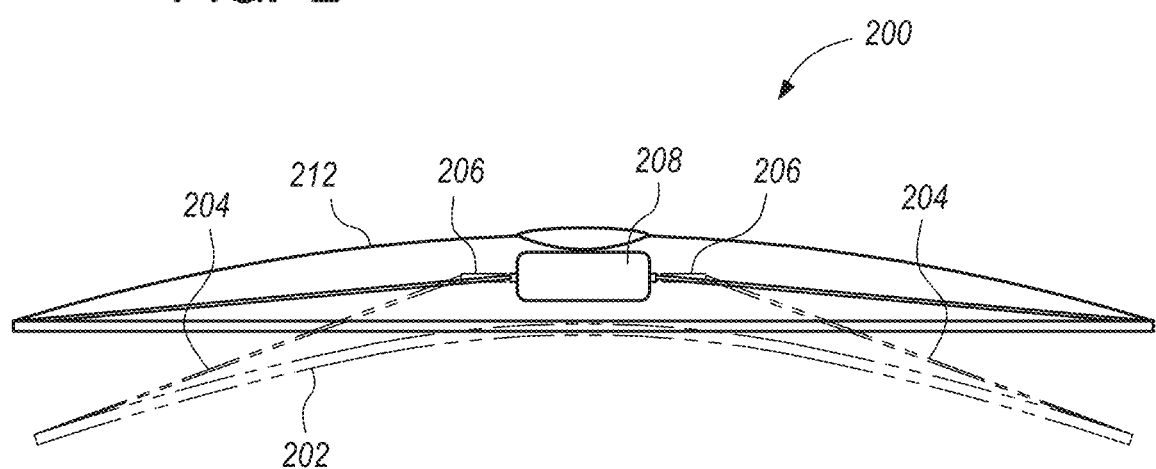
FIG. 2 illustrates a top view of one embodiment of the technique for a dynamic curved screen.

FIG. 2 illustrates, generally at 200, a top view of one example embodiment of the technique for dynamically adjusting a curvature of a screen 202. Screen 202 may be a FOLED attached to sheet metal as mentioned above, for example. In this example, the curvature of the screen may be adjusted using an actuator 208 configured to change the curvature of the screen. In one embodiment, actuator 208 may be self-locking so that the screen only changes curvature under control of the actuator. Actuator 208 may be implemented using various gear box techniques as illustrated in more detail below. In the example embodiment shown here, the actuator 208 may be coupled to sliding links 206 and connecting links 204, which may be configured to change the curvature of the screen, for example. Connecting links are illustrated at 204, which in this example include left side link and a right side link. At 206 is shown horizontal sliding links, which in this example include a right side sliding link and a left side sliding link. At 210 is a representative point on the vertical centerline screen which may be fixedly attached to a housing (or body) 212 of the display, for example.

In FIG. 2 what is to be appreciated is that the actuator 208 can extend and retract the horizontal sliding links 206 which in turn drive connecting links 204 which are attached to the edges of the screen 202. Accordingly, as the connecting links are moved, the edges of the screen move while the fixed center of the screen does not move, and thus the radius of curvature of the screen may be changed. In this example, if the actuator 208 retracts the horizontal sliding links 206, then the connecting links 204 will be drawn toward the actuator and the edges of the screen will move causing less curvature of the screen 202. Likewise, if the actuator 208 extends the horizontal sliding links 206, then the connecting links 204 will be driven away from the actuator and the edges of the screen will move causing more curvature of the screen 202.

While the screen 202 in FIG. 2 may be attached to sheet metal, for example, the technique is not so limited. In other embodiments, a screen may be attached to other flexible substrate materials, such as, for example, flexible carbon fiber, flexible plastics, flexible composites, flexible metal, etc. In one technique, the flexible screen has sufficient structural integrity that the edges of the flexible screen may be directly attached to the connecting links, and a portion of the flexible screen along the vertical centerline is attached to the housing of the display to anchor the screen and form a three point arc (2 edges and 1 center). Additionally, while links are illustrated here as comprising sliding links and connecting links, it is to be understood that a single link on the left side and a single link on the right sides may be used for the sliding and connecting links, for example.

Figure 3:
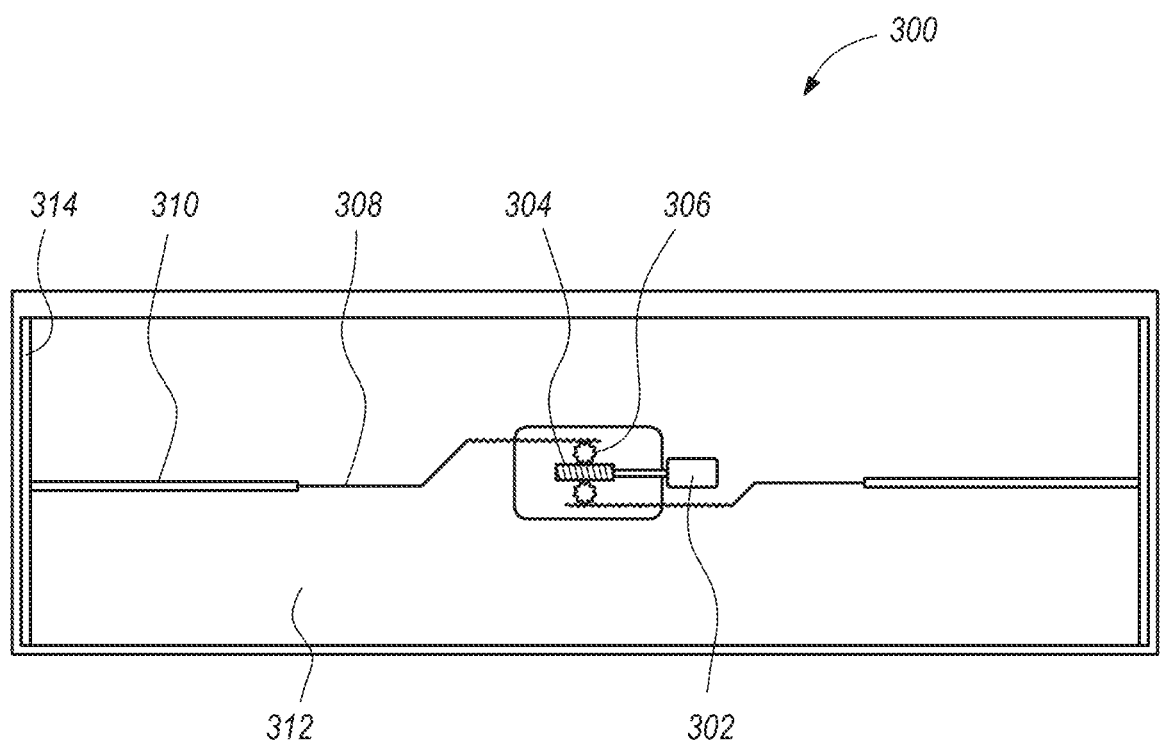
FIG. 3 illustrates a back view of one embodiment of the technique for a dynamic curved screen.

FIG. 3 illustrates, generally at 300, a back view of one embodiment including one example actuator. At 302 is shown a motor coupled to a worm drive, which translates rotational motion into linear motion using at least a worm gear. In this example, the worm drive includes a worm gear 304 engaged to a gear 306 (aka a worm wheel). The gear 306 engages with the horizontal sliding links 308 (only left side indicated), and the horizontal sliding links 308 are connected to the connecting links 310 (only left side indicated). At 312 is shown the back side of a flexible screen, such as a flexible LED (e.g., a FOLED). Connecting links 310 (left side indicated) connect to an attachment member 314 (left side indicated) which is located at or near the edge of the screen 312.

When a sensor measures the distance of the viewer to the display, it sends the information to an electronic control system (e.g., a processor, not shown). The electronic control system, in turn, sends a signal to the actuator (e.g., the motor and worm drive). Based on the signal from the sensor, the control system then drives the motor to rotate either in a clockwise or counterclockwise direction to adjust the curvature. In this example, the worm gear is connected to the output shaft of the motor, and thus rotates in the same direction as the motor shaft. When the worm gear 304 rotates, it turns gear 306 and pushes or pulls the horizontal sliding links based on the direction of rotation. In this example, the horizontal sliding links, in turn, lift or retract members 314 coupled to the outer edges of the screen, for example. The amount of lift is directly proportional to the number of turns of the worm gear. When the outer edges are lifted and the vertical center line is fixed, the radius of the curved screen is changed. In one embodiment, the actuator may be designed such that only the input to the actuator may adjust the screen curvature, but not the return force of the screen (e.g., the force on the links cannot change the curvature). This can be achieved by designing the actuator to be self-locking, for example.

In this example, the actuator may include a worm drive that is self-locking, such that the direction of displacement is not reversible when using large gear reduction ratios. For example, the worm gear can drive the worm wheel but not vice-versa (example worm gears and worm wheels are illustrated below). As is known to those skilled in the art, this phenomenon occurs when the co-efficient of friction between the worm gear and the worm wheel is larger than the tangent of the worm gear's lead angle. Co-efficient of friction is dependent on the type of material used. However, self-locking is also dependent on the angles used in the gears, which can be designed as per the requirement to make the worm drive self-lockable. It is to be understood that various embodiments may use a variety of worm gear and worm wheel configurations, such as non-throated, throated, double-throated, enveloping, double-enveloping, etc.

By utilizing self-locking, there won't be continuous power consumption by the motor to keep the screen in one position for a long time, and the return force from the screen and/or sheet metal will not push back the worm gear and alter the curvature of the screen. In some embodiments, when the system is powered down the motor can pull back the outer edges of the screen and make it flat inside the housing. This way the system stack height will be reduced.

Figure 4:
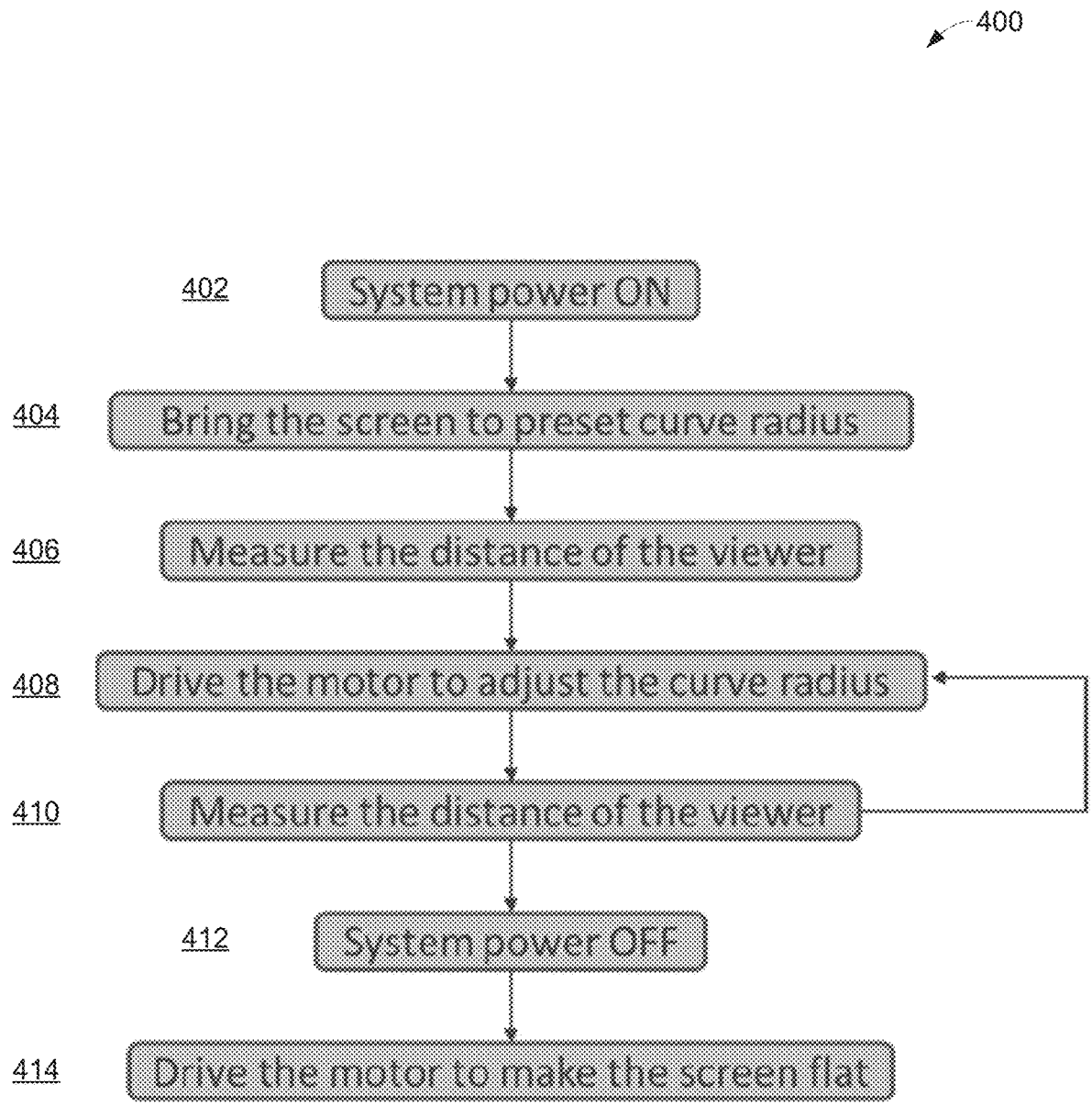
FIG. 4 illustrates one embodiment of the technique in flow chart form.

FIG. 4 illustrates, generally at 400, one embodiment of the technique in flow chart form. At 402 the system powers on. That is, the display housing the screen is powered up. After the display is powered up at 402, the screen (part of the display) is brought to a preset curvature (curve radius). At 406 the distance to the viewer (or multiple viewers) is measured. Once the distance is measured at 406, then at 408 the motor is driven to adjust the curvature (curve radius). Then at 410 the distance to the viewer is measured again and at 408 the curvature is adjusted, if needed. When the system is powered off at 412, the motor may drive the screen to a nominal position (e.g., flat with no curvature), for example.

Figure 5:
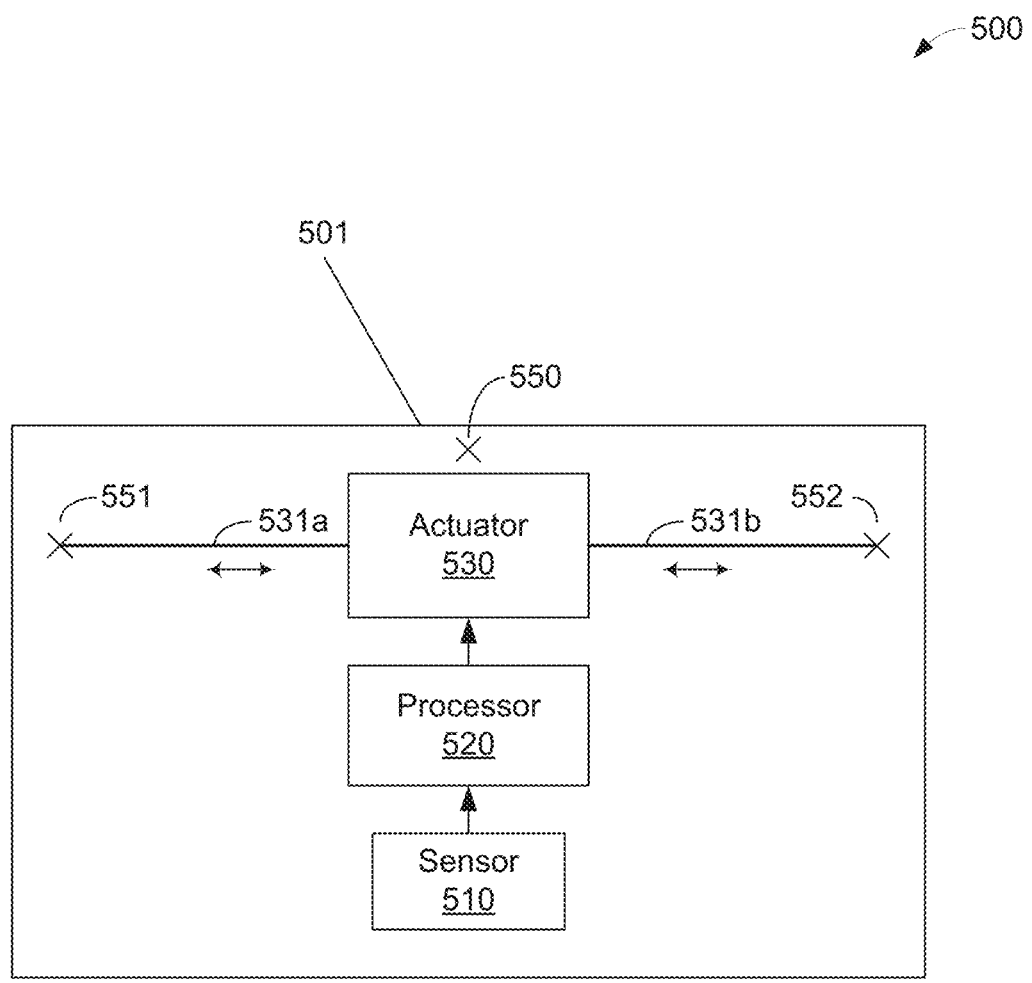
FIG. 5 illustrates an example electronic diagram of an embodiment.
Figure 8:
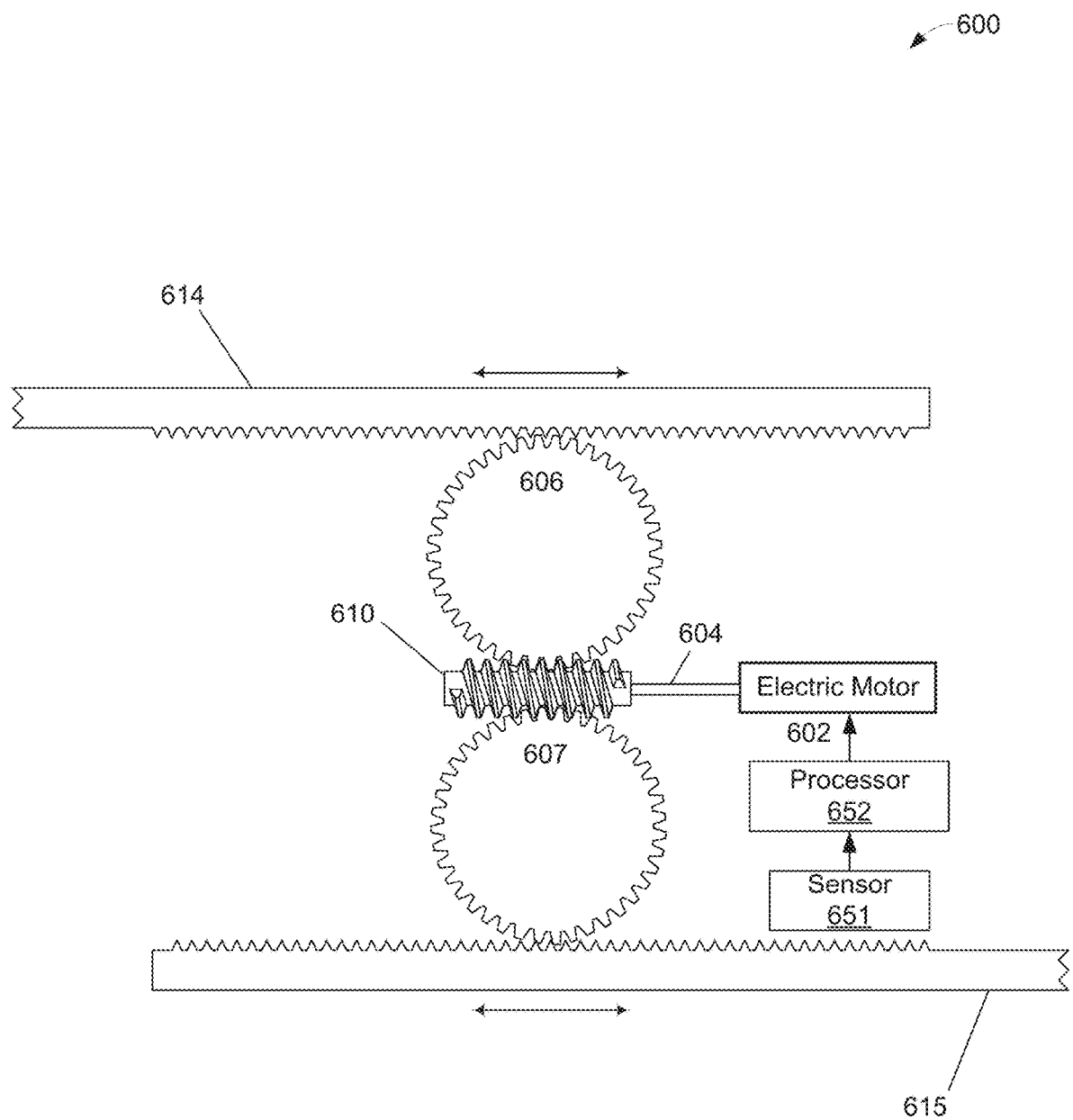

FIG. 5 illustrates an example electronic diagram of an embodiment. In this example, a sensor 510 generates a signal corresponding to a position of a user. Sensor 510 may produce an analog or digital output. For an analog output, a digital to analog converter (not shown) may be used to digitize the signal from sensor 510, for example. The output of sensor 510 may be coupled to a processor 520. Processor 520 may be a microprocessor, microcontroller, or a digital processing circuit included as part of a system on a chip ("SOC") that performs a variety of functions for the display, for example. Processor 520 may execute an algorithm for converting the signal into another signal to control actuator 530. Actuator 530, in turn, controls the position of links 531 (i.e., left and right links 531a-b), which are attached to the screen (or a screen substrate such as sheet metal) at points 551 and 552. In this example, the screen is attached along a centerline of the screen at 550. Generally, the signal from sensor 510 may indicate a distance between a user and the display. Thus, the distance may be mapped to a predetermined position of the actuator 530 and links 531. For example, the actuator may initially position the links in a first position corresponding to a flat screen. Next, the received signal corresponding to distance may be mapped to a second position corresponding to the screen having a predetermined curvature. Accordingly, the processor generates a signal to reconfigure the actuator and links into the second position based on the distance detected between the user and the screen. If the user moves, the distance signal may again trigger a repositioning of the actuator and links, thus adjusting the curvature again.

FIG. 6 illustrates, generally at 600, one example embodiment of an actuator. In this example, one or more sensors 651 send information to processor 652, and processor control an electric motor 602. The electric motor 602 includes a shaft 604 that drives a worm gear 610. The rotation position of the shaft (e.g., in degrees from a nominal position) may be calibrated to corresponding particular curvatures, which may be associated with distances represented by the information from sensor(s) 651, for example. As worm gear 610 is rotated by motor 602, gears 606 and 607 (e.g., worm wheels) are also rotated. Link 614 is configured to engage gear 606 (e.g., with interlocking teeth as shown), and link 615 is configured to engage gear 607.

Link 614 may be coupled to a left edge of a screen, and link 615 may be coupled to a right edge of a screen, for example. Accordingly, when motor shaft 604 rotates worm gear 610 in a first direction, link 606 is moved to the right and link 607 moves to the left (e.g., flattening the screen). Conversely, when motor shaft 604 rotates worm gear 610 in the opposite direction, link 606 is moved to the left and link 607 moves to the right (e.g., increasing the curvature of the screen). While the above example illustrates movement of links 614 and 615 using a worm gear with one worm wheel, it is to be understood that a variety of other gear arrangements may be used in other implementations as would be understood by those skilled in the art. In some embodiments, the links may be coupled to different movement systems so that the links may be moved independently, for example.

Figure 7:
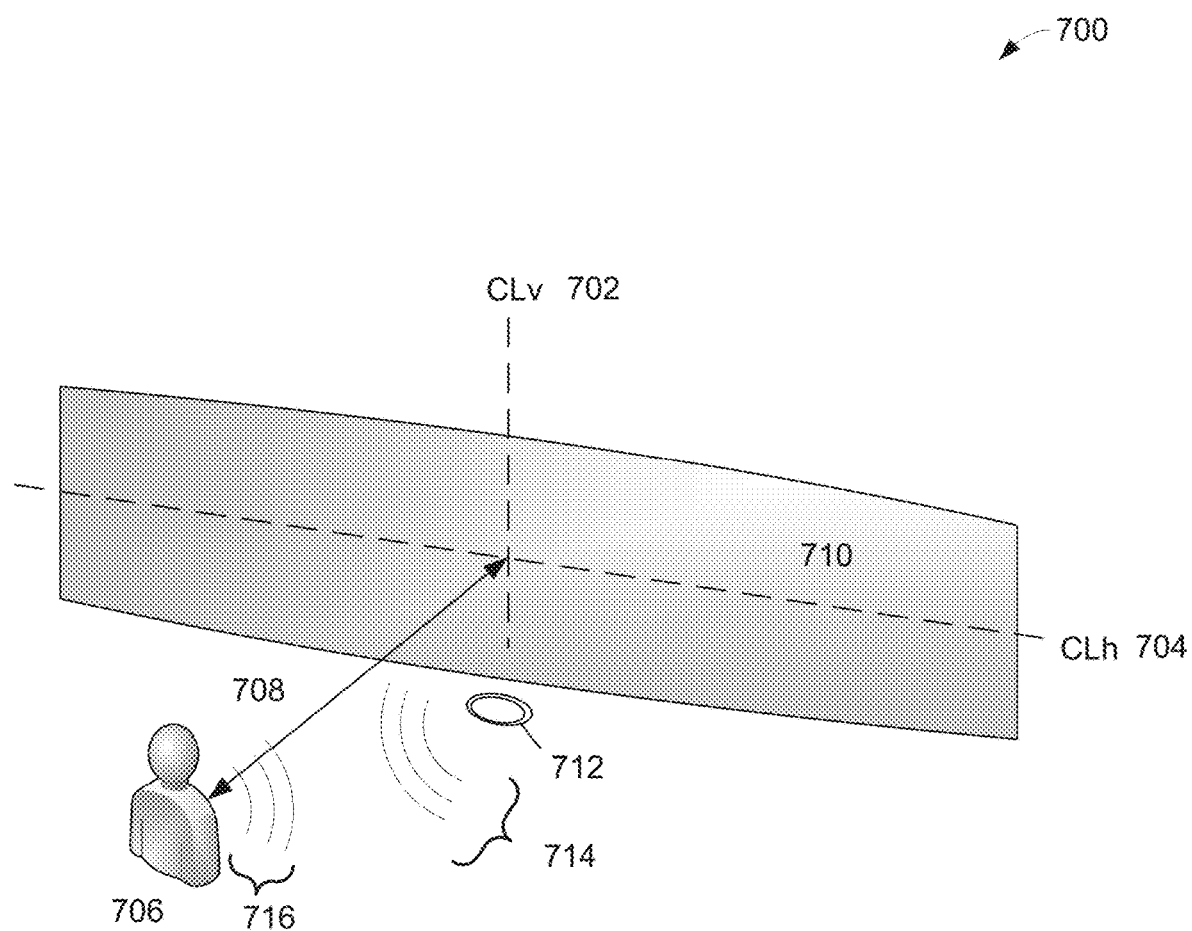
FIG. 7 illustrates an embodiment showing a time of flight (ToF) sensor.

FIG. 7 illustrates, generally at 700, an embodiment where a position of a user 706 is measured as a distance 708 between the user 706 and the vertical center line (CLv) 702 of a screen 710. 704 represents the horizontal center line 1304 (CLh) of the screen 710. Features and advantages of some embodiments may determine the position of the user relative to the vertical centerline and adjust the curvature of the screen relative to vertical center. For example, in one embodiment the screen is fixed (e.g., to a display housing) along the vertical centerline and the edges may be allowed to move. A sensor 712 may be placed along the vertical centerline. Accordingly, sensor 712 may sense a position of a user 1306 in front of the screen 710 as a distance 708 measurement using a time of flight (ToF). In a time of flight sensor, a signal is sent out from sensor 712. The signal reflects off the user 706 and the reflected signal is detected by sensor 712. The time between the transmitted signal and reflected signal may be measured and converted into a distance, for example. 714 indicates representatively the wave emission from ToF sensor 712 and 716 indicates representatively a reflection of the wave emission from the user 706 back to the ToF sensor 712. While sensor 712 is illustrated here is being positioned at the bottom of screen 710, it is to be understood that the sensor may be placed in other positions (e.g., at the top of the screen). Furthermore, in other embodiments, multiple sensors may be placed at the top, bottom, and/or edges of the display and multiple distance measurements may be obtained and used to determine the position of the user to adjust the curvature of the screen, for example. Additionally, it is to be understood that a variety of time of flight sensors may be used. Time of flight may be measured, for example, by direct measurement and/or phase shifts using electromagnetic or sonic waves (e.g., RF, LIDAR, LED, laser, etc.). Accordingly, the time of flight sensor(s) may be a laser sensor, a light emitting diode sensor, an ultrasonic sensor, an infrared sensor, and a radio frequency (RF) sensor, for example.

Further Examples

In various embodiments, the present disclosure may be implemented as an apparatus, method, or system. For example, the present disclosure may be embodied in any of the following, alone or in various combinations.

In one embodiment, the present disclosure includes a display comprising a flexible screen, a sensor configured to sense a position of a user in front of the screen, and an actuator configured to adjust a curvature of the flexible screen based on the distance.

In one embodiment, the sensor determines a distance between the user and the screen.

In one embodiment, the sensor is located at a horizontal center of the display.

In one embodiment, the flexible screen is fixed at a horizontal center of the display.

In one embodiment, the display further comprises a processor coupled to the sensor to receive a signal corresponding to the distance, wherein the actuator comprises an electric motor coupled to the processor to adjust the curvature of the flexible screen.

In one embodiment, the actuator comprises: an electric motor; a motion converter coupled to the electric motor; and one or more mechanical links coupled between the motion converter and the flexible screen, wherein the electric motor and motion converter move the one or more mechanical links to adjust the curvature of the flexible screen.

In one embodiment, the flexible screen is mounted to a substrate and the substrate is coupled to the one or more mechanical links.

In one embodiment, the motion converter comprises a worm drive.

In one embodiment, the one or more mechanical links are coupled proximate to edges of the flexible screen, and wherein the flexible screen is fixed along a vertical centerline of the flexible screen.

In one embodiment, the one or more mechanical links comprise: a first link coupled to a gear; a second link coupled to the gear; a third link coupled between the first link and the screen to adjust a first edge of the screen; and a fourth link coupled between the second link and the screen to adjust a second edge of the screen.

In one embodiment, the screen is a flexible light emitting diode screen.

In one embodiment, the screen is a flexible organic light emitting diode (FOLED) screen.

In one embodiment, the sensor is one of a laser sensor, a light emitting diode sensor, a ultrasonic sensor, an infrared sensor, and a radio frequency (RF) sensor.

In another embodiment, the present disclosure includes a method for dynamically adjusting the curvature of a flexible screen comprising: sensing a distance between a user and the flexible screen; activating a motion converter based on the distance; and adjusting the curvature of the flexible screen via the motion converter based on the distance.

In one embodiment, sensing the distance comprises determining a time of flight (ToF) of a signal.

In one embodiment, the signal is generated by a sensor, wherein the sensor is one of a laser sensor, a light emitting diode sensor, a ultrasonic sensor, an infrared sensor, and a radio frequency (RF) sensor.

In one embodiment, the flexible screen is a flexible organic light emitting diode screen.

In another embodiment, the present disclosure includes a display comprising: a flexible screen; means for determining a distance between a user and the flexible screen; and means for adjusting a curvature of the flexible screen based on the distance.

In one embodiment, the means for adjusting comprises a self-locking gear assembly.

In one embodiment, the means for adjusting comprises: at least one electric motor; at least one worm gear; and at least one worm wheel.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A display comprising:
   a flexible screen;
   a sensor configured to sense a position of a user in front of the screen;
   a processor coupled to the sensor to receive a signal corresponding to the position; and
   an actuator configured to adjust a curvature of the flexible screen based on the position,
   wherein the actuator comprises an electric motor coupled to the processor to adjust the curvature of the flexible screen.

2. The display of claim 1 wherein the sensor determines a distance between the user and the screen.

3. The display of claim 1 wherein the sensor is located at a horizontal center of the display.

4. The display of claim 1 wherein the flexible screen is fixed at a horizontal center of the display.

5. The display of claim 1 wherein the actuator comprises:
   a motion converter coupled to the electric motor; and
   one or more mechanical links coupled between the motion converter and the flexible screen,
   wherein the electric motor and motion converter move the one or more mechanical links to adjust the curvature of the flexible screen.

6. The display of claim 5 wherein the flexible screen is mounted to a substrate and the substrate is coupled to the one or more mechanical links.

7. The display of claim 5 wherein the motion converter comprises a worm drive.

8. The display of claim 5 wherein the one or more mechanical links are coupled proximate to edges of the flexible screen, and wherein the flexible screen is fixed along a vertical centerline of the flexible screen.

9. The display of claim 5 wherein the one or more mechanical links comprise:
   a first link coupled to a gear;
   a second link coupled to the gear;
   a third link coupled between the first link and the screen to adjust a first edge of the screen; and
   a fourth link coupled between the second link and the screen to adjust a second edge of the screen.

10. The display of claim 1 wherein the screen is a flexible light emitting diode screen.

11. The display of claim 1 wherein the screen is a flexible organic light emitting diode screen.

12. The display of claim 1 wherein the sensor is one of a laser sensor, a light emitting diode sensor, an ultrasonic sensor, an infrared sensor, and a radio frequency (RF) sensor.

13. A method for dynamically adjusting the curvature of a flexible screen comprising:
   sensing a distance between a user and the flexible screen by determining a time of flight (ToF) of a signal;
   activating a motion converter based on the distance; and
   adjusting the curvature of the flexible screen via the motion converter based on the distance.

14. The method of claim 13 wherein the signal is generated by a sensor, wherein the sensor is one of a laser sensor, a light emitting diode sensor, an ultrasonic sensor, an infrared sensor, and a radio frequency (RF) sensor.

15. The method of claim 13 wherein the flexible screen is a flexible organic light emitting diode screen.

16. A display comprising:
   a flexible screen;
   means for determining a distance between a user and the flexible screen; and
   means for adjusting a curvature of the flexible screen based on the distance,
   wherein the means for adjusting comprises a self-locking gear assembly.

17. The display of claim 16 wherein the means for adjusting comprises:
   at least one electric motor;
   at least one worm gear; and
   at least one worm wheel.

* * * * *